United States Patent
Birnkrant et al.

(10) Patent No.: US 10,508,360 B2
(45) Date of Patent: Dec. 17, 2019

(54) MULTIFUNCTIONAL NANOCELLULAR SINGLE CRYSTAL NICKEL FOR TURBINE APPLICATIONS

(71) Applicant: UNITED TECHNOLOGIES CORPORATION, Hartford, CT (US)

(72) Inventors: Michael J Birnkrant, Kenilworth, NJ (US); Weina Li, South Glastonbury, CT (US)

(73) Assignee: United Technologies Corporation, Farmington, CT (US)

(*) Notice: Subject to any disclaimer, the term of this patent is extended or adjusted under 35 U.S.C. 154(b) by 458 days.

(21) Appl. No.: 14/600,029

(22) Filed: Jan. 20, 2015

(65) Prior Publication Data

US 2016/0251772 A1   Sep. 1, 2016

(51) Int. Cl.
*C30B 7/04* (2006.01)
*C30B 7/14* (2006.01)
(Continued)

(52) U.S. Cl.
CPC ............... *C30B 7/04* (2013.01); *C30B 7/06* (2013.01); *C30B 7/14* (2013.01); *C30B 29/02* (2013.01);
(Continued)

(58) Field of Classification Search
CPC .......... C30B 29/02; C30B 29/52; C30B 7/04; C30B 7/06; C30B 7/14; F01D 11/001;
(Continued)

(56) References Cited

U.S. PATENT DOCUMENTS 7,144,220 B2   12/2006   Marcin, Jr.
8,327,911 B2   12/2012   Kush et al.
(Continued)

FOREIGN PATENT DOCUMENTS

CN   1792521   6/2006
CN   103173865   6/2013
(Continued)

OTHER PUBLICATIONS

Tientong et al, Synthesis of Nickel and Nickel Hydroxide Nanopowders by Simplified Chemical Reduction, Journal of Nanotechnology, vol. 2014, Article ID 193162, 6 pages.*

(Continued)

*Primary Examiner* — Hua Qi
(74) *Attorney, Agent, or Firm* — Bachman & LaPointe, P.C.

(57) ABSTRACT

A nanocellular single crystal nickel based material is provided having a thermal diffusivity in the range of 0.0002 cm^2/s to 0.02 cm^2/s and a thermal conductivity in the range of 0.024 W/mK to 9.4 W/mK. The nanocellular single crystal nickel based material may be used to form turbine engine components. The nanocellular single crystal nickel based material may be produced by providing a first solution containing a nickel precursor and deionized water, providing a second solution containing a structure controlling polymer/surfactant and an alcohol, mixing the first and second solutions into a solution containing a reducing agent to form a third solution, and processing the third solution to create the nanocellular single crystal based material.

7 Claims, 3 Drawing Sheets

(51) Int. Cl.
| | |
|---|---|
| *C30B 29/52* | (2006.01) |
| *C30B 7/06* | (2006.01) |
| *C30B 29/02* | (2006.01) |
| *F01D 5/02* | (2006.01) |
| *F01D 5/28* | (2006.01) |
| *F01D 9/02* | (2006.01) |
| *F01D 11/00* | (2006.01) |
| *F01D 11/08* | (2006.01) |
| *F01D 25/12* | (2006.01) |
| *F04D 29/38* | (2006.01) |
| *F04D 29/58* | (2006.01) |
| *F23R 3/00* | (2006.01) |
| *F01D 5/18* | (2006.01) |

(52) U.S. Cl.
CPC ............... *C30B 29/52* (2013.01); *F01D 5/02* (2013.01); *F01D 5/28* (2013.01); *F01D 9/02* (2013.01); *F01D 11/001* (2013.01); *F01D 11/08* (2013.01); *F01D 25/12* (2013.01); *F04D 29/388* (2013.01); *F04D 29/582* (2013.01); *F23R 3/002* (2013.01); *F01D 5/183* (2013.01); *F05D 2220/30* (2013.01); *F05D 2240/35* (2013.01); *F05D 2300/514* (2013.01); *F05D 2300/606* (2013.01); *F05D 2300/608* (2013.01)

(58) Field of Classification Search
CPC . F01D 11/08; F01D 25/12; F01D 5/02; F01D 5/183; F01D 5/28; F01D 9/02; F04D 29/388; F04D 29/582; F05D 2220/30
See application file for complete search history.

(56) References Cited

U.S. PATENT DOCUMENTS

| | | | |
|---|---|---|---|
| 9,339,870 B2 | 5/2016 | Son et al. | |
| 2007/0237669 A1* | 10/2007 | Lee | B22F 1/0018 420/441 |
| 2010/0031775 A1* | 2/2010 | Seo | B22F 9/24 75/364 |
| 2010/0324193 A1* | 12/2010 | Herbiet | C01F 7/02 524/437 |
| 2012/0231340 A1* | 9/2012 | Imanari | C01G 53/44 429/221 |
| 2014/0044951 A1 | 2/2014 | Beals et al. | |
| 2014/0363676 A1* | 12/2014 | Son | B22F 1/0018 428/403 |

FOREIGN PATENT DOCUMENTS

| | | |
|---|---|---|
| EP | 1 623 776 | 2/2006 |
| JP | 2011122248 | 6/2011 |
| WO | 2013085249 A1 | 6/2013 |

OTHER PUBLICATIONS

Tientong et al, Journal of Nanotechnology, vol. 2014, Article ID 193162, 6 pages (Year: 2014).*

Tientong et al., "Synthesis of Nickel Hydroxide Nanopowders by Simplified Chemical Reduction", Hindawi Publishing Corporation, Journal of Nanotechnology, vol. 2014, 6 pages.

European search report for Application No. 16151813.9-1373 dated Jun. 28, 2016.

European Office Action dated Mar. 27, 2019 issued for corresponding European Patent Application No. 16151813.9.

* cited by examiner

MULTIFUNCTIONAL NANOCELLULAR SINGLE CRYSTAL NICKEL FOR TURBINE APPLICATIONS

BACKGROUND

The present disclosure relates to a multifunctional nanocellular single crystal nickel material and to a process for manufacturing same.

In gas turbine engines, it is advantageous to form various engine components from multifunctional materials. This is because even small additions of these materials to the engine results in significant gains in efficiency. In this regard, it has been proposed to use cellular solids, such as foams or porous materials, to form structural components.

Conventional metallic foams can be produced from compacted powders containing blowing agents, such as adsorbed gases, that decompose when the metal powder is heated above its melting point. The gas foams the melt producing a porous solid upon solidification. Metal foams of this type typically have pores in the millimeter size range and with mechanical properties not suitable for gas turbine application. In particular, a cellular solid or foam with porosity may not stand up to applied stresses or impacts.

SUMMARY

A single crystal cellular solid with porosity may have pore and ligaments in the range of 0.05 to 100 microns. At this size scale, the structural and thermal behavior of the ligaments and the pores is not treatable in a conventional thermal and mechanical sense. The material may behave like a dense solid. Yet, the air flow or the fluid flow through the small pores provides a significant benefit over conventional porosity. The ability to produce single crystal porous nickel with nanosize pores offers potential to achieve high strength to density, high strain tolerance, and other unusual combinations of physical and chemical properties when ligament sizes are smaller than one micron and surface-to-volume ratio exceeding one million inverse meters.

In accordance with the present disclosure, there is provided a process for manufacturing a nanocellular single crystal nickel based material which broadly comprises the steps of providing a first solution containing a nickel precursor and deionized water, providing a second solution containing a structure controlling polymer/surfactant and an alcohol, mixing the first and second solutions into a solution containing a reducing agent to form a third solution, and processing the third solution to create a nanocellular single crystal nickel based material.

In another and further embodiment, the first solution providing step may comprises forming a solution containing nickel nitrate hexahydrate and deionized water.

In another and further embodiment, the second solution providing step may comprise mixing polyvinyl pyrrolidine and ethylene glycol.

In another and further embodiment, the mixing step may comprise mixing the first and second solutions into a solution containing hydrazine.

In another and further embodiment, the processing step may comprise stirring the third solution at a temperature in the range of 100° C. to 130° C. for a time period in the range of 5.0 minutes to 15 minutes.

In another and further embodiment, the processing step may further comprise removing sol from the stirred third solution and then centrifuging the third solution at a speed of 2000 rpm to 5000 rpm for a time in the range of 5.0 min to 15 min.

In another and alternative embodiment, the processing step may further comprise removing sol from the centrifuged solution and leaving a nickel based cellular structure material.

In another and alternative embodiment, the processing step may further comprise washing the nickel based cellular structure material in a solution containing an alcohol and deionized water to remove soluble inorganic salts and organic solvents from the nickel based cellular structure material, subjecting the washing solution to sonication for a time period in the range of 5.0 min to 15 min., and performing a filtration step to remove the washing solution from the cellular structure material.

In another and alternative embodiment, the process may further comprise adding at least one additive selected from the group consisting of cobalt, chromium, tungsten, rhenium, and molybdenum to the first solution.

Further, in accordance with the present disclosure, there is provided a material which broadly comprises a nanocellular single crystal nickel based material having a thermal diffusivity in the range of 0.0002 $cm^2/s$ to 0.02 $cm^2/s$ and a thermal conductivity in the range of 0.024 W/mK to 9.4 W/mK.

In another and alternative embodiment, the material may further have a strength in the range of 5.0 GPa to 114 GPa.

In another and alternative embodiment, the material may further have a porosity in the range of 15% to 70%.

In another and alternative embodiment, the material may further have a plurality of pores with each pore having a size in the range of 50 nm to 25 microns.

In another and alternative embodiment, the pores may have a size in the range of 50 nm to 6.0 microns.

Still further in accordance with the present disclosure, there is provided a turbine engine component comprising a structure at least partially formed from a nanocellular single crystal nickel based structure having a plurality of pores, an overall cooling effectiveness in the range of 0.4 to 1.0, and a mass flow rate in the range of 1e-2 to 1e-7.

In another and alternative embodiment, the structure may comprise a skin joined to another portion of the turbine engine component.

In another and alternative embodiment, the structure may comprise at least one window joined to another portion of the turbine engine component.

In another and alternative embodiment, the turbine engine component may comprise one of a BOAS, a vane, a blade, a fan blade, a combustor liner, a rotor for a blade, and a knife edge seal.

In another and alternative embodiment, the turbine engine component may be entirely formed from the nanocellular single crystal nickel based material.

Other details of the multifunctional nanocellular single crystal nickel material for turbine applications are set forth in the following detailed description and the accompanying drawings, wherein like reference numerals depict like elements.

DETAILED DESCRIPTION

Solution Processing with Templating Metal

Figure 1:
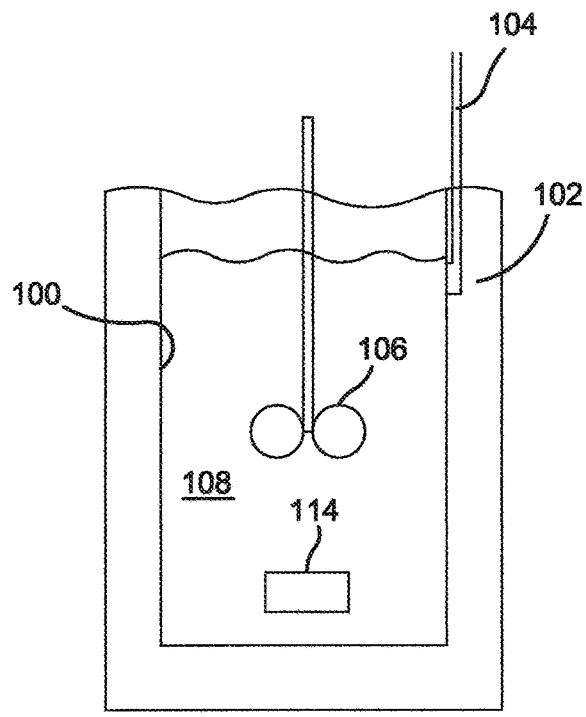
FIG. 1 is a schematic representation of a reaction vessel used to form a multifunctional nanocellular single crystal nickel based material.
Figure 2:
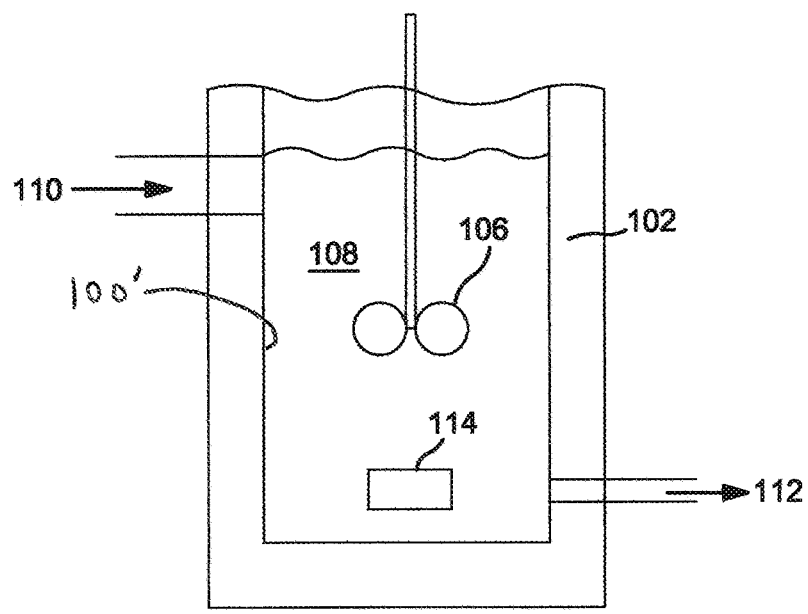
FIG. 2 is a schematic representation of a continuous flow reactor that may be used to form a multifunctional nanocellular single crystal nickel based material.

The fabrication of a single crystal nanocellular nickel coupon can be achieved using a reaction vessel similar to FIG. 1. The reaction vessel components may include a glass lined reactor 100 surrounded by a heating jacket 102. A thermocouple 104 may be placed in the reactor 100 or between the reactor 100 and the heating jacket 102. Together, the heating jacket 102 and the thermocouple 104 may be used to control the reaction temperature. An impeller 106 may be immersed in the solution 108 in the reactor 100. The impeller 106 vortexes the solution 108 to ensure a homogeneous isothermal mixture is maintained. The reactor 100 can be the batch reactor shown in FIG. 1. In another embodiment, the reactor 100' can be a continuous flow reactor in which solution flows into the reactor 100' via the inlet 110 and out of the reactor 100' via the outlet 112.

The nucleation of a single crystal nickel nanocellular material such as a coupon 114 can be achieved with or without a seed. The seed material provides a starting place for single crystal growth. In cases without a seed, homogeneous nucleation occurs to produce a porous single crystal nickel starting material. The starting material acts as the seed. The growth of the porous single crystal nickel continues as nickel ions in solution are reduced on the surface of the seed.

Figure 3:
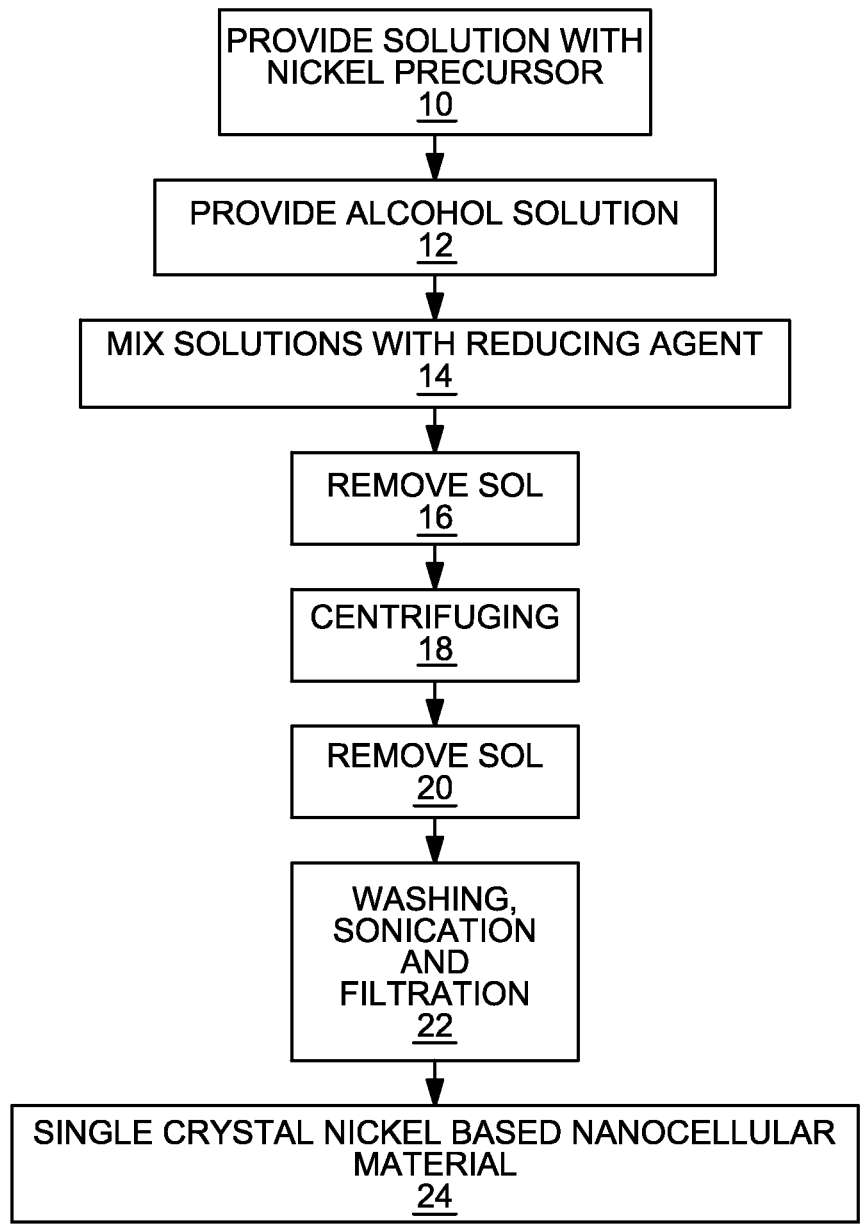
FIG. 3 is a schematic representation of a process for manufacturing a nanocellular single crystal nickel based material.

Referring now to FIG. 3, there is shown a process for manufacturing a multifunctional nanocellular single crystal nickel based material. The nickel based material may be a single crystal nickel or a single crystal nickel alloy.

The process may begin as shown in step 10 by preparing or providing a first solution containing a nickel precursor in deionized water. The nickel precursor may be selected from the group consisting of nickel nitrate hexahydrate, nickel chloride, nickel sulfate, nickel oxalate, and other nickel salts. The nickel precursor may be present in the deionized water in an amount from 0.05 mol. to 0.2 mol., and the balance of the solution may be the deionized water.

In step 12, a second solution may be prepared or provided which contains an alcohol such as ethylene glycol and a structure controlling polymer, or a surfactant, such as polyvinyl pyrrolidine which may be present in the range of 1.0 wt % to 5.0 wt % with a molecular weight between 1000 g/mol and 10 million g/mol.

In step 14, the first and second solutions may then be mixed into a solution of a reducing agent such as hydrazine to form a third solution. The hydrazine may be 35 wt % or 50 wt %. The third solution is placed in the reactor 100 or 100'. A stir may be performed using the impeller 106 at a temperature in the range of 100° C. to 130° C. for a time period in the range of 5.0 min to 15 min. The stir may be performed as a reflux operation.

A physical change in the third solution can be observed after step 14 indicating a reaction has occurred. The light green clear solution changes to a colorless clear solution called the sol with a dark solid substance.

In step 16, any excess sol which has been created may be removed from the third solution containing the reducing agent and the nickel precursor using a pipette.

In step 18, the third solution may then be centrifuged at a speed in the range of 2000 rpm to 5000 rpm for a time period in the range of 5.0 min to 15 min.

In step 20, any remnant sol separated during the centrifuging step may be removed from the third solution using a pipette. The product is a cellular structure material though it may be contaminated with salts and solvents.

In step 22, washing of the solid mass of nickel may be performed with a washing solution. The washing solution may contain an alcohol and deionized water to remove soluble inorganic salts and organic solvents, such as ethylene glycol. The fourth solution may be subjected to sonication for a time period in the range of 5.0 min to 15 min. Then a filtration step may be performed to remove the washing solution from the cellular structure material.

In step 24, there results a single crystal nickel based nanocellular material.

The chemical reaction when using hydrazine to form the single crystal nickel based nanocellular material is:

$$Ni^{2+}+2e^- \rightarrow Ni; E^0 = -0.25V \text{ and}$$

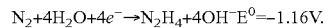
$$N_2+4H_2O+4e^- \rightarrow N_2H_4+4OH^- E^0 = -1.16V.$$

The single crystal nickel based nanocellular material formed in this manner has numerous beneficial properties. The single crystal nickel based nanocellular material has nanoporosity with pores having a size ranging from 50 nm to 25 microns. In one beneficial embodiment, the pores have a size which ranges from 50 nm to 6.0 microns. The foregoing dimensions are the diameter of an approximately cylinder shaped pore or the diameter of a spherically shaped pore.

A single nickel nanocellular body formed as described herein may have a thermal diffusivity in the range of 0.0002 cm^2/s to 0.02 cm^2/s. It may also have a thermal conductivity in the range of 0.24 W/mK to 9.4 W/mK; a strength in the range of 5.0 GPa to 114 GPa; and a porosity in the range of 15% to 70%.

If desired, the single crystal nickel based nanocellular material may be a nickel based alloy. The additives to the nickel may be one or more of aluminum for strength and oxidation resistance; cobalt for microstructural control; chromium for oxidation and corrosion resistance; tungsten, rhenium, and/or tantalum for improved creep strength; hafnium and/or yttrium for oxidation resistance; and hafnium and/or zirconium for grain boundary ductility. Cobalt, tungsten and rhenium may be added into the third solution to co-precipitate the alloy during the formation of porous single crystal nickel. Hafnium, yttrium, and zirconium may be reduced by another reducer or reducers in the third solution or prepared by other methods such as electrochemical routes. Other elements, such as aluminum, chromium can be fabricated as a coating via various preparation approaches, such as wet chemistry, electrochemistry, or chemical vapor deposition (CVD) methods.

Figure 4:
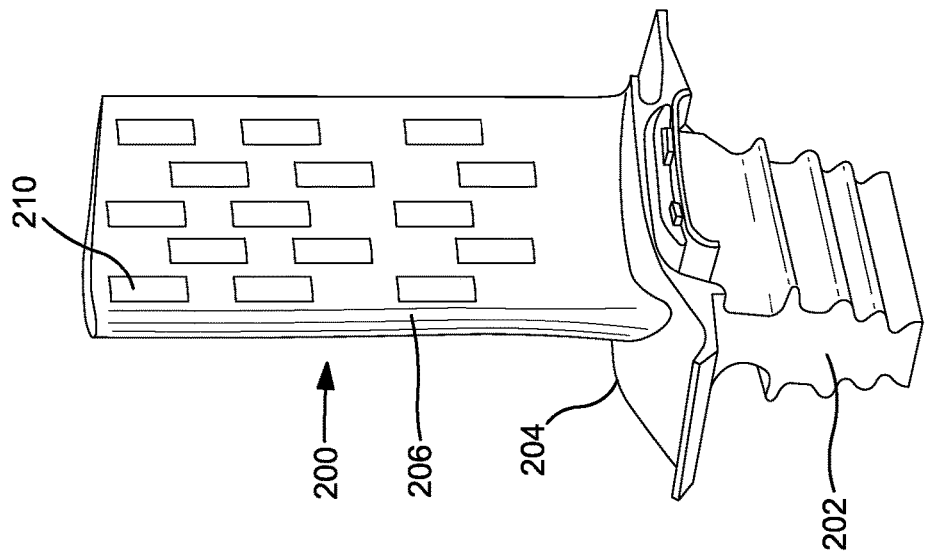
FIG. 4 is a schematic representation of a turbine engine component having a plurality of coupons formed from a nanocellular single crystal nickel based material.
Figure 5:
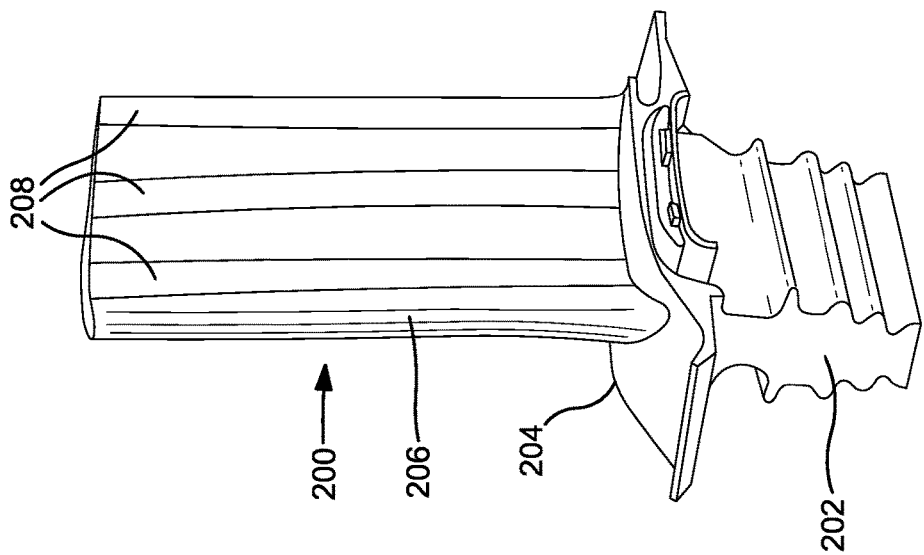
FIG. 5 is a schematic representation of another turbine engine component having a plurality of windows formed from a nanocellular single crystal nickel based material.

The single crystal nanocellular nickel based alloy material formed by the method described herein may be used to form all or a portion of a turbine engine component such as vanes, blades, BOAS, fan blades, combustor liners, rotors for blades, and knife edge seals. When used to form part of a turbine engine component, a piece of the single crystal nanocellular nickel based material may be machined into a desired shape and then brazed onto a component formed from a different material. For example, the single crystal nanocellular nickel based material may be used to form a skin for the turbine engine component. Referring now to FIG. 4, there is shown a turbine engine component 200 having a root portion 202, a platform 204 and an airfoil 206. A portion of the skin of the airfoil 206 is formed by single crystal nanocellular nickel based material coupons 208. There may be one or more coupons 208. In another exemplary embodiment, as shown in FIG. 5, pieces of the single crystal nanocellular nickel based material may be joined to the turbine engine component 200 as a plurality of windows 210 to provide a cooling benefit. The cooling benefit is due to the porosity of the single crystal nanocellular nickel based material which reduces the cooling fluid needed to cool the turbine engine component. Using the coupons 208, or the windows 210, the turbine engine component 200 may have an overall cooling effectiveness in the range of from 0.4 to 1.0 and a mass flow rate of in the range of from 1e-2 to 1e-7.

There has been provided in this disclosure a multifunctional nanocellular single crystal nickel based material which may be used in turbine engine applications. While the nanocellular single crystal nickel based material has been described in the context of specific embodiments thereof, there may be unforeseen alternatives, modifications, and variations which will become apparent to those skilled in the art having read the foregoing description. Accordingly, it is intended to embrace those alternatives, modifications, and variations as fall within the broad scope of the appended claims.

What is claimed is:

1. A process for manufacturing a nanocellular single crystal based material comprising steps of:
   providing a first solution containing a nickel precursor in deionized water;
   providing a second solution containing a structure controlling polymer or a surfactant and an alcohol;
   mixing said first and second solutions into a solution containing a reducing agent to form a third solution; and processing said third solution to create the nanocellular single crystal based material; wherein said processing comprises stirring said third solution at a temperature in a range of 100° C. to 130° C. for a time period in a range of 5.0 minutes to 15 minutes;
   removing sol from said stirred third solution and then centrifuging said third solution at a speed of 2000 rpm to 5000 rpm for a time in a range of 5.0 min. to 15 min;
   removing sol from said centrifuged third solution and leaving a product of the nanocellular single crystal based material;
   washing said nanocellular single crystal based material in a washing solution containing an alcohol and deionized water to remove soluble inorganic salts and organic solvents from the nanocellular single crystal based material, subjecting the washing solution to sonication for a time period in the range of 5.0 to 15 min., and then performing a filtration step to remove the washing solution from the nanocellular single crystal based material; wherein the nanocellular single crystal based material comprises pores and ligaments in the range of 0.05 to 100 microns.

2. The process of claim 1, wherein said nickel precursor comprises a nickel nitrate hexahydrate.

3. The process of claim 1, wherein said second solution comprises said surfactant comprising polyvinyl pyrrolidine and said alcohol comprising ethylene glycol.

4. The process of claim 1, wherein said reducing agent comprises hydrazine.

5. The process of claim 1, further comprising adding at least one additive selected from the group consisting of aluminum, cobalt, chromium, tungsten, rhenium, tantalum, hafnium, yttrium, and zirconium to one of said solutions.

6. The process of claim 1, wherein the nanocellular single crystal based material comprises a nanoporosity with pores having a size ranging from 50 nm to 25 microns.

7. The process of claim 6, wherein said pores have a size in the range of 50 nm to 6.0 microns.

* * * * *